United States Patent
Nan et al.

(10) Patent No.: US 9,520,538 B2
(45) Date of Patent: Dec. 13, 2016

(54) LED EPITAXIAL STRUCTURE AND FABRICATION METHOD THEREOF

(71) Applicant: XIAMEN SANAN OPTOELECTRONICS TECHNOLOGY CO., LTD., Xiamen (CN)

(72) Inventors: Qi Nan, Xiamen (CN); Hsiang-Pin Hsieh, Xiamen (CN); Nan Qiao, Xiamen (CN); Wenyan Zhang, Xiamen (CN); Hongmin Zhou, Xiamen (CN); Lan Li, Xiamen (CN); Wei Cheng, Xiamen (CN); Zhijun Xu, Xiamen (CN); Honghao Wu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/748,195

(22) Filed: Jun. 23, 2015

(65) Prior Publication Data
US 2015/0318448 A1  Nov. 5, 2015

Related U.S. Application Data

(63) Continuation of application No. PCT/CN2014/071044, filed on Jan. 22, 2014.

(30) Foreign Application Priority Data

Apr. 19, 2013 (CN) .......................... 2013 1 0137286

(51) Int. Cl.
H01L 33/44 (2010.01)
H01L 33/06 (2010.01)
(Continued)

(52) U.S. Cl.
CPC ............. *H01L 33/44* (2013.01); *H01L 33/007* (2013.01); *H01L 33/04* (2013.01); *H01L 33/06* (2013.01);
(Continued)

(58) Field of Classification Search
CPC .............................................. H01L 2933/0025
See application file for complete search history.

(56) References Cited

U.S. PATENT DOCUMENTS 5,670,798 A * 9/1997 Schetzina ............. H01L 29/205
257/101
5,831,277 A * 11/1998 Razeghi ................. B82Y 20/00
257/103

(Continued)

*Primary Examiner* — Charles Garber
*Assistant Examiner* — Ankush Singal
(74) *Attorney, Agent, or Firm* — Syncode LLC; Feng Ma; Junjie Feng

(57) ABSTRACT

An LED epitaxial structure includes a substrate; a GaN nucleating layer; a superlattice buffer layer comprising a plurality pairs of alternately stacked AlGaN/n-GaN structures; an n-GaN layer; a MQW light-emitting layer, a p-GaN layer and a p-type contact layer. Al(n) represents Al composition value of the $n^{th}$ AlGaN/n-GaN superlattice buffer layer pair; N(n) represents n-type impurity concentration value of the $n^{th}$ AlGaN/n-GaN superlattice buffer layer pair; variation trend of Al(n) is from gradual increase to gradual decrease, and for N(n) is from gradual increase to gradual decrease. The structure can effectively and sufficiently release the lattice stress due to lattice mismatch between the sapphire substrate and GaN at the bottom layer growth section, thereby greatly reducing wrapping of the epitaxial wafer throughout high-temperature growth process, improving wavelength concentration and yield of the epitaxial wafer, improving GaN lattice quality, reducing lattice dislocation density and improving stability of photoelectric characteristics.

11 Claims, 5 Drawing Sheets

(51) Int. Cl.
  *H01L 33/08* (2010.01)
  *H01L 33/00* (2010.01)
  *H01L 33/04* (2010.01)
  *H01L 33/12* (2010.01)
  *H01L 33/32* (2010.01)

(52) U.S. Cl.
  CPC .............. *H01L 33/08* (2013.01); *H01L 33/12* (2013.01); *H01L 33/32* (2013.01); *H01L 2933/0025* (2013.01); *H01L 2933/0033* (2013.01)

(56) References Cited

U.S. PATENT DOCUMENTS

| | | | | | |
|---|---|---|---|---|---|
| 6,104,039 | A * | 8/2000 | Asatsuma | ............. | H01L 29/205 257/102 |
| 6,194,241 | B1 * | 2/2001 | Tsutsui | ................ | H01L 21/0242 257/E21.113 |
| 6,775,314 | B1 * | 8/2004 | Waldrip | ................. | B82Y 20/00 372/43.01 |
| 6,958,497 | B2 * | 10/2005 | Emerson | ............. | H01L 21/0237 257/103 |
| 7,112,830 | B2 * | 9/2006 | Munns | ................. | H01L 29/155 257/12 |
| 7,193,246 | B1 * | 3/2007 | Tanizawa | ............... | B82Y 20/00 257/101 |
| 7,692,182 | B2 * | 4/2010 | Bergmann | ............. | B82Y 20/00 257/14 |
| 7,826,505 | B2 * | 11/2010 | Son | ........................ | B82Y 20/00 372/43.01 |
| 8,044,384 | B2 * | 10/2011 | Bergmann | .......... | H01L 21/0237 257/13 |
| 8,314,415 | B2 * | 11/2012 | Strassburg | ............. | B82Y 20/00 257/15 |
| 8,536,615 | B1 * | 9/2013 | Driscoll | .................. | H01L 33/06 257/101 |
| 8,604,461 | B2 * | 12/2013 | Driscoll | .............. | H01L 21/0237 257/15 |
| 2001/0038655 | A1 * | 11/2001 | Tanaka | .................... | B82Y 20/00 372/43.01 |
| 2002/0195619 | A1 * | 12/2002 | Makimoto | ............. | H01L 33/32 257/197 |
| 2003/0015715 | A1 * | 1/2003 | Sakai | ...................... | B82Y 20/00 257/79 |
| 2004/0219702 | A1 * | 11/2004 | Nagai | ................. | H01L 21/0237 438/46 |
| 2007/0069234 | A1 * | 3/2007 | Won | ........................ | B82Y 20/00 257/103 |
| 2008/0128678 | A1 * | 6/2008 | Lee | ......................... | B82Y 20/00 257/13 |
| 2008/0157121 | A1 * | 7/2008 | Ohki | .................... | H01L 29/7787 257/194 |
| 2008/0273566 | A1 * | 11/2008 | Nishinaka | ................ | H01L 33/32 372/45.012 |
| 2010/0081226 | A1 * | 4/2010 | Abramov | ............... | B82Y 20/00 438/47 |
| 2011/0163349 | A1 * | 7/2011 | Sakai | .................. | H01L 21/0237 257/99 |
| 2012/0313076 | A1 * | 12/2012 | Nakamura | .......... | H01L 33/0075 257/13 |
| 2013/0032810 | A1 * | 2/2013 | Chen | ..................... | H01L 33/007 257/76 |
| 2013/0168691 | A1 * | 7/2013 | Sakai | .................. | H01L 21/0243 257/76 |
| 2013/0223463 | A1 * | 8/2013 | Kawaguchi | ............. | B82Y 20/00 372/45.01 |
| 2013/0228742 | A1 * | 9/2013 | Tanaka | .................... | H01L 33/06 257/13 |
| 2014/0091314 | A1 * | 4/2014 | Ishiguro | ............ | H01L 29/66462 257/76 |
| 2015/0179880 | A1 * | 6/2015 | Fang | ....................... | H01L 33/14 257/76 |

* cited by examiner

LED EPITAXIAL STRUCTURE AND FABRICATION METHOD THEREOF

CROSS-REFERENCE TO RELATED APPLICATIONS

The present application is a continuation of, and claims priority to, PCT/CN2014/071044 filed on Jan. 22, 2014, which claims priority to Chinese Patent Application No. 201310137286.3 filed on Apr. 19, 2013. The disclosures of these applications are hereby incorporated by reference in their entirety.

BACKGROUND

Most existing commercial LED epitaxial wafers are epitaxied through MOCVD. For a lack of substrate matching with GaN lattice, most GaN-based LED epitaxial wafers are epitaxied over substrates of other material through heterogeneous epitaxy. Some common heterogeneous epitaxial substrates include sapphire ($Al_2O_3$), silicon carbide (SiC), etc. In consideration of large lattice mismatch and thermal expansivity difference between GaN and substrate, it is impossible to directly grow high-quality GaN epitaxial structure. As shown in FIG. 1, in existing and conventional GaN-based LED epitaxial structure, two-step growth method is adopted. Taking sapphire substrate as example, first, grow one GaN nucleating bottom layer under low-temperature environment (400° C.-700° C.). Under low-temperature environment, a two-dimensional layered growth is impossible, but a GaN nucleating seed can be formed to provide nucleating conditions for further high-quality two-dimensional layered growth; then, rise temperature to above 1000° C. and form a high-quality GaN layer structure with appropriate growth rate and VIII ratio; last, continuously grow an n-GaN layer, a MQW active layer and a p-GaN layer via epitaxy over the high-quality and undoped GaN structure layer to form a complete GaN-based LED epitaxial structure.

The two-step growth method can solve such problems as poor GaN crystallization quality and large warping stress resulted from large lattice mismatch and thermal expansivity difference between substrate and GaN and is widely applied in commercial scale production. Despite above achievements, this epitaxy method also has some problems. For example, the low-temperature GaN nucleating layer and high-temperature non-doped GaN buffer layer, after growth, can only reach surface flatness of relative height difference at dozens of nm level, indicating that a higher quality of GaN crystallinity is not yet improved, which is particularly significant in high-power device fabrication. As GaN crystallinity quality at bottom layer cannot be further improved, film resistance of the n-GaN layer, MQW active layer and p-GaN layer formed over it through epitaxy cannot be further reduced. On the one hand, in large-size chip applications, e.g., in large-power devices of 45 mil*45 mil chip size, when 350 mA current is energized, the work voltage $V_F$ is generally 3.1V or above due to accumulative series connection of film resistance of the entire epitaxial structure, which greatly reduces photoelectric conversion efficiency and increases non-radiative recombination rate, generating more heat energy and shortening service life of power devices. On the other hand, to reduce LED production cost, more and more commercial productions have introduced epitaxy and chip processing technology at larger size, e.g., from existing 2-inch substrate and epitaxial wafer to 4-inch and even 6-inch ones, to increase output per unit time and reduce production cost. Substrate and epitaxial wafer at larger size may lead to larger wrapping and lattice stress due to lattice and thermal expansivity mismatch, which cannot form a good two-dimensional layered growth structure over the original 2-inch small size epitaxial wafer. Therefore, scale production of epitaxial wafer at larger size (e.g., 4-inch or above) is impossible due to such problems as poor crystallinity at GaN bottom layer, large surface roughness, low electrical yield after growth of complete structure, high probability of large work voltage $V_F$ and low wavelength yield.

To solve the above problems, Chinese patent CN201110451083.2 discloses an insert layer between high-temperature undoped GaN buffer layer and N-type GaN layer, and such insert layer is overlaid with an $Al_xGa_{1-x}N$ layer, an $In_yAl_{1-y}N$ or an $Al_xGa_{1-x}N$ layer and an $In_yAl_{1-y}N$ layer, in which, 0.1<x<1.0, and 0<y<0.25. Advantages of such insert layer include improvement of lateral movement of electron over N-type GaN layer, higher carrier injection efficiency, and effective reduction of film resistance and work voltage $V_F$. However, it still cannot effectively solve wrapping and lattice stress from lattice mismatch and thermal mismatch.

SUMMARY

To solve defects of existing LED epitaxial growth technology, the present disclosure provides a LED epitaxial structure with an AlGaN superlattice bottom buffer layer with parabolic linear gradient Al compositions and fabrication method thereof, in which, the epitaxial structure, from bottom to up, comprises a substrate; a GaN nucleating layer epitaxied over the substrate; a superlattice buffer layer comprising a plurality pairs of AlGaN/n-GaN structure layers over the GaN nucleating layer; an n-GaN layer epitaxied over the AlGaN/n-GaN superlattice buffer layer; a MQW light-emitting layer epitaxied over the N-type GaN layer, a p-GaN layer epitaxied over the MQW light-emitting layer and a p-type contact layer epitaxied over the p-GaN layer; as defined, the Al(n) represents Al composition value of the $n^{th}$ AlGaN/n-GaN superlattice buffer layer pair; N(n) represents n-type impurity concentration value of the $n^{th}$ AlGaN/n-GaN superlattice buffer layer pair; variation trend of Al(n) is from gradual increase to gradual decrease, and variation trend of N(n) is from gradual increase to gradual decrease.

The superlattice buffer layer comprising a plurality pairs of AlGaN/n-GaN structure layers is a superlattice buffer layer alternately stacked by superlattice matching layers fabricated by AlGaN layers and superlattice matching layers, in which, the AlGaN layers are of different Al composition matching ratios after parabolic linear gradient of Al compositions in AlGaN, and the superlattice matching layers are fabricated by n-GaN layers doped with n-type impurities.

Preferably, variation trends of Al(n) and N(n) meet relational expressions: Al(n) =Yn*Al(n−1) and N(n)=Yn*N(n−1), wherein, Yn follows parabolic linear equation $$Yn = -a\left(n - \frac{N+1}{2}\right)^2 + \frac{a(N+1)^2}{4},$$

where, a is a fixed constant; N represents total number of pairs of superlattice buffer layers; n represents the $n^{th}$ superlattice buffer layer, in which 1<n≤N and 0<a≤18.

Preferably, each group of lattice buffer layer pair is defined as comprising a plurality of AlGaN/n-GaN superlattice buffer layer pairs, in which, Al(m) represents the Al composition value of the $m^{th}$ group AlGaN/n-GaN superlattice buffer layer pair; N(m) represents the n-type impurity concentration value of the $m^{th}$ group AlGaN/n-GaN superlattice buffer layer pair; variation trends of Al(m) and N(m) meet relational expressions: Al(m)=Ym*Al(m-1) and N(m)=Ym*M(m-1), wherein, Ym follows parabolic linear equation $$Ym = -a\left(m - \frac{M+1}{2}\right)^2 + \frac{a(M+1)^2}{4},$$

where, a is a fixed constant, M represents total number of groups comprising a plurality pairs of superlattice buffer layers; and m represents the $m^{th}$ group superlattice buffer layer pair, in which $1 < m \leq M$ and $0 < a \leq 18$.

Preferably, the substrate can be sapphire ($Al_2O_3$), silicon carbide (SiC), silicon (Si), germanium (Ge), gallium nitride (GaN), aluminum gallium nitride (AlGaN) or aluminum nitride (AlN).

Preferably, number of AlGaN/n-GaN superlattice buffer layer pairs varies from 3 to 40, and the n-type doping impurity in n-GaN is Si, and the p-type doping impurity is Mg.

Preferably, the Al composition of the AlGaN/n-GaN superlattice buffer layer and the n-type doping concentration of corresponding n-GaN superlattice matching layer follow same parabolic proportional relationship as: the Al(n), as defined, represents Al composition value of the $n^{th}$ AlGaN/n-GaN superlattice buffer layer pair; N(n) represents n-type impurity concentration value of the $n^{th}$ AlGaN/n-GaN superlattice buffer layer pair; Yn represents pair-to-pair proportion coefficient of the superlattice structure, Al(n)=Yn*Al(n-1) and N(n)=Yn*N(n-1), wherein, Yn follows parabolic linear equation $$Yn = -a\left(n - \frac{N+1}{2}\right)^2 + \frac{a(N+1)^2}{4},$$

where, a is a fixed constant; N is total number of pairs of superlattice buffer layers, and n represents the $n^{th}$ pair of superlattice. Since the Al compositions and the n-type impurity concentration value in the first pair of AlGaN/n-GaN superlattice buffer layer are directly set based on actual requirements and the proportional coefficient fails to meet the formula, it is agreed as follow: n is a positive integral more than 1, and $1 < n \leq N$, i.e., n ranges from 2 to N, and $0 < a \leq 18$.

Preferably, Al composition of the AlGaN layer of each pair of AlGaN/n-GaN superlattice buffer layers varies from 0% to 40%, and the n-type impurity concentration of corresponding matching n-GaN layer varies from $5 \times 10^{16}$ cm$^{-3}$ to $1 \times 10^{19}$ cm$^{-3}$.

Preferably, thickness of the AlGaN layer of each pair of AlGaN/n-GaN superlattice buffer layers varies from 0.1 nm to 40 nm, and thickness of the corresponding matching n-GaN layer varies from 0.3 nm to 120 nm.

Preferably, thickness ratio of the AlGaN layer and corresponding n-GaN layer of each pair of AlGaN/n-GaN superlattice buffer layers is 1:5-1:1.

Compared with conventional LED epitaxial structure, the present disclosure can provide epitaxial wafers of high photo-electric performance and wavelength yield for large power devices, in particular, large size (e.g., 4-inch or above) epitaxial wafer application, which can effectively avoid wrapping effect and stress due to epitaxial lattice and thermal mismatch between substrate and GaN, further reduce dislocation of epitaxial structure and improve photo-electric performance. A light-emitting system, such as a display system or a lighting system, can employ a plurality of such LED epitaxial structures.

Figure 1:
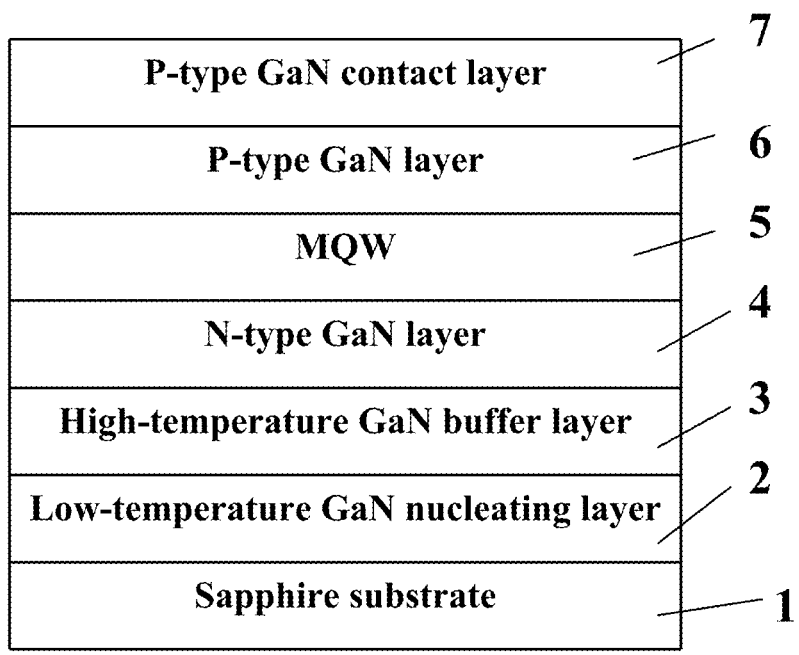
FIG. 1 is a conventional GaN-based LED epitaxial structure.

In the drawings:
1: Sapphire substrate; 2: Low-temperature GaN nucleating layer; 3: High-temperature GaN buffer layer; 4: N-type GaN layer; 5: MQW active layer; 6: P-type GaN layer; 7: P-type GaN contact layer; 8: First high-temperature AlGaN buffer layer; 9: First high-temperature GaN buffer layer; 10: Second high-temperature AlGaN buffer layer; 11: Second high-temperature GaN buffer layer; 12: $N^{th}$ high-temperature AlGaN buffer layer; 13: $N^{th}$ high-temperature GaN buffer layer.

DETAILED DESCRIPTION

Further and detailed descriptions will be given for the present disclosure in combination with drawings and embodiments to clearly represent related technical contents, characteristics and effects of present disclosure.

Embodiment 1

Figure 2:
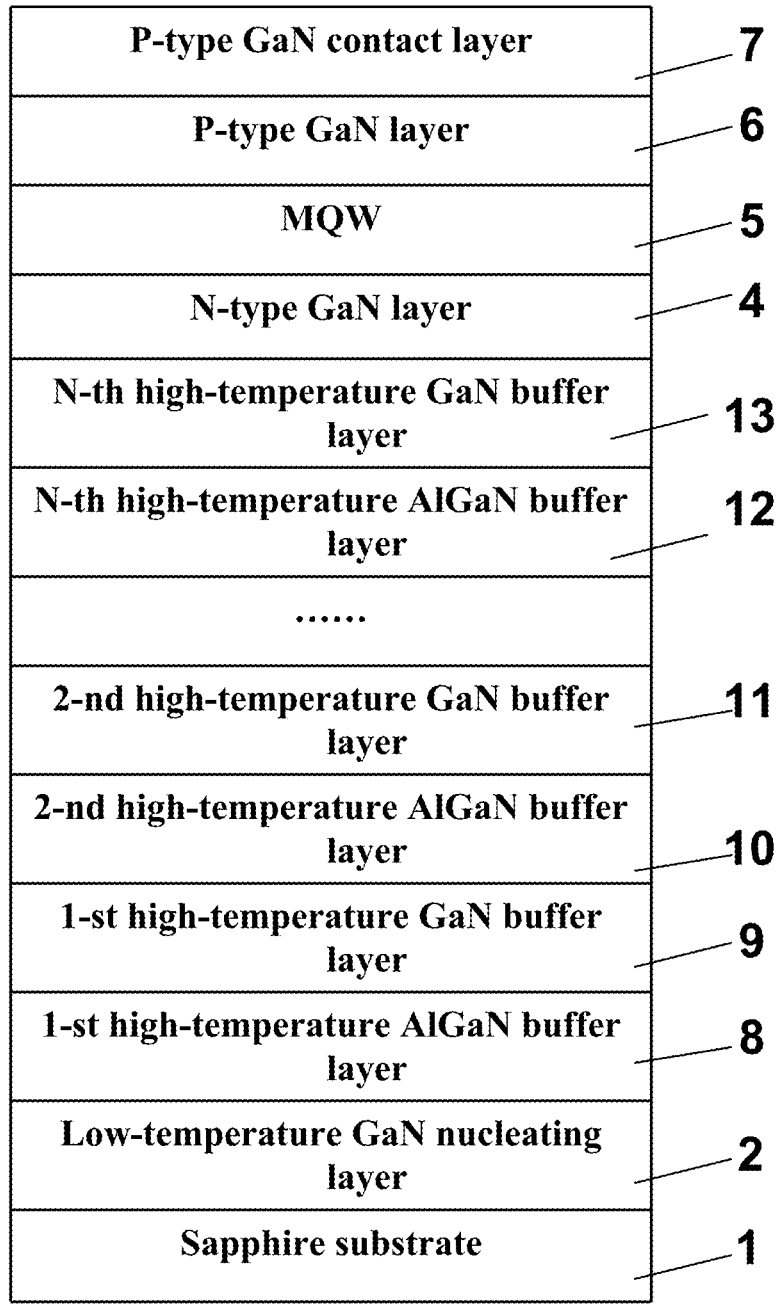
FIG. 2 is a GaN-based LED epitaxial structure of Embodiment 1.

With reference to FIG. 2, a LED epitaxial structure with an AlGaN/n-GaN superlattice bottom buffer layer with parabolic linear gradient Al compositions, on the basis of actual process requirements and substrate sizes, appears superlattice bottom buffer layer structure of different circular numbers of different composition ratios, in which, number of circular pairs ranges from 3 to 40; Al composition of AlGaN layer ranges from 0% to 40% with thickness from 0.1 nm to 40 nm; and doping concentration of n-type impurity in corresponding matching n-GaN layer ranges from $5 \times 10^{16}$ cm$^{-3}$ to $1 \times 10^{19}$ cm$^{-3}$ with thickness from 0.3 nm to 120 nm; thickness ratio between the AlGaN and the n-GaN layer is 1:5-1:1; Al composition and n-type doping concentration of each AlGaN/n-GaN superlattice buffer layer are only determined by those of the previous pair of AlGaN/n-GaN and follow equations: Al(n)=Yn*Al(n−1) and N(n)=Yn*N(n−1), where, Al(n) represents the Al composition of the $n^{th}$ AlGaN/n-GaN superlattice buffer layer pair; N(n) represents n-type impurity concentration value of the $n^{th}$ AlGaN/n-GaN superlattice buffer layer pair; Yn represents pair-to-pair proportional coefficient in the superlattice structure; proportional coefficient of the Al composition variation is consistent with that of the n-type impurity concentration and is a variable; the variation relationship follows parabolic linear equation $$Yn = -a\left(n - \frac{N+1}{2}\right)^2 + \frac{a(N+1)^2}{4},$$

where, a is a fixed constant, N represents total number of superlattice buffer layer pairs; n represents the $n^{th}$ pair of superlattice, in which, 3≤N≤40, 1<n≤N and 0<a≤18, i.e., the Al composition concentration value of the current superlattice buffer layer is Yn times of that of the previous superlattice buffer layer, and the n-type doping concentration value of the current superlattice buffer layer is also Yn times of that of the previous superlattice buffer layer, in which, proportional coefficient Yn is a variable and its rational expression with total number of superlattice pairs N is $$Yn = -a\left(n - \frac{N+1}{2}\right)^2 + \frac{a(N+1)^2}{4},$$

where, a is based on performance and specification of each specific product. The larger is the structure substrate, the bigger is the wrapping stress during structure growth process. In addition, larger number of circular pairs and higher Al composition are required and a value gets smaller. Only in this way, the wrapping and lattice stress can be released effectively. At the same time, by taking advantage of the superlattice bottom buffer layer structure with parabolic linear gradient relationship, a good connection is made to the previous n-GaN structure layer to prevent too much structural mutation from resulting in helical dislocation and to greatly reduce film resistance at bottom layer. Other advantages include avoidance of second return after release of lattice wrapping and lattice stress and improvement of release effects. Therefore, the LED epitaxial structure grown based on such buffer layer structure is featured by small dislocation, high photoelectric performance, good wavelength yield and high luminous power, which have prominent edge in high-power devices.

Figure 3:
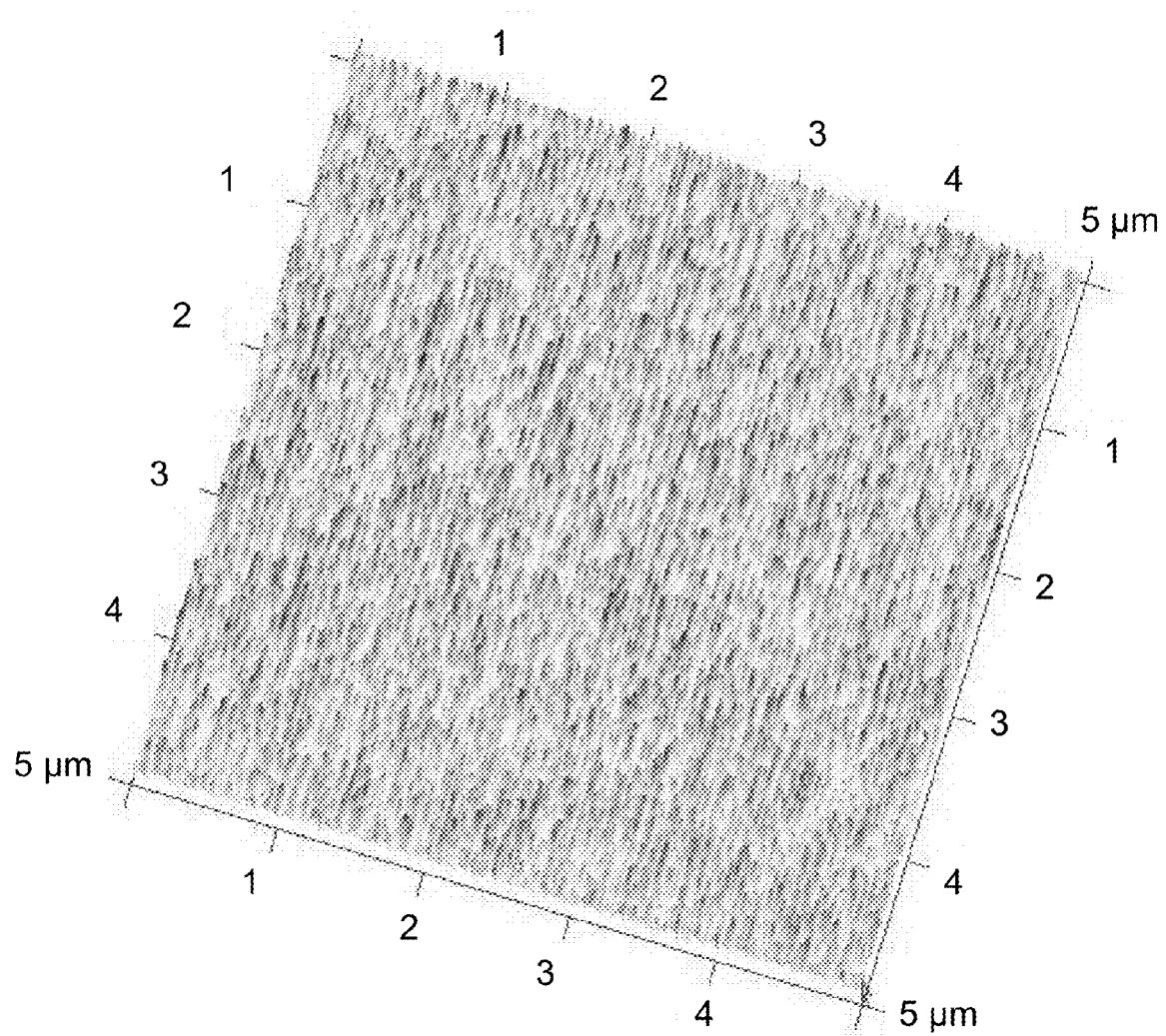
FIG. 3 is a surface scanning drawing by AFM measurement of a conventional GaN-based LED bottom layer that grows to n-GaN layer.
Figure 4:
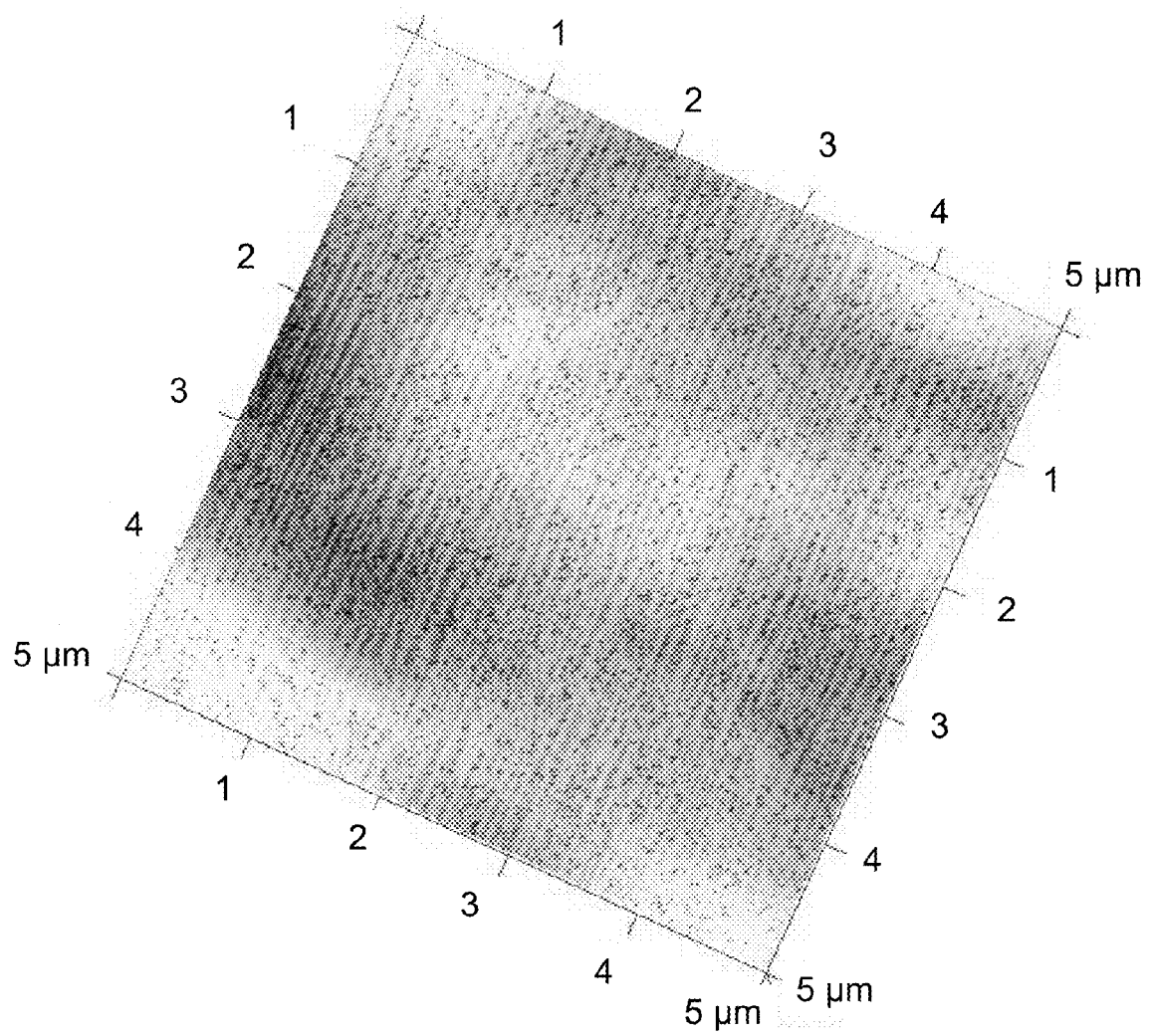
FIG. 4 is a surface scanning drawing by AFM measurement of the GaN-based LED bottom layer in Embodiment 1 that grows to n-GaN layer.
Figure 5:
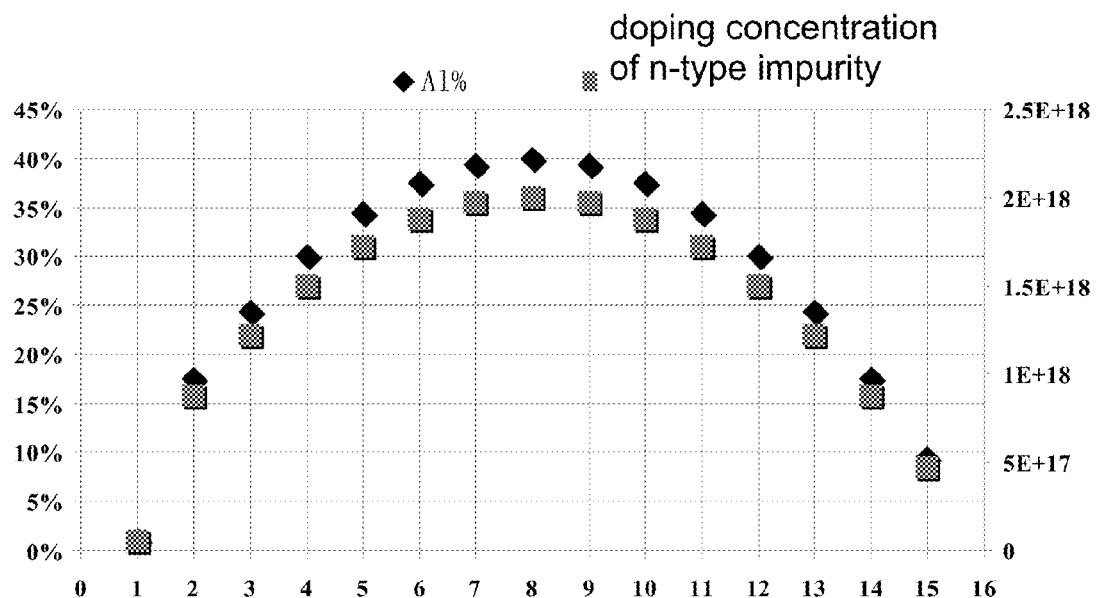
FIG. 5 is a trend drawing of Al compositions and n-type impurity concentrations with change of number of superlattice pairs in optimized superlattice structure of the GaN-based LED bottom layer in Embodiment 1 that grows to n-GaN layer.

With references to FIGS. 3 and 4, effectiveness of present invention is verified by measurement and characterization of surface characteristics of epitaxial films grown based on this embodiment and conventional bottom buffer layer structure. Specific embodiment is as follows: grow two types of different bottom layer structures over 4-inch sapphire substrate through MOCVD method till n-GaN layer (only for measurement and characterization and further epitaxy is required later), and the n-GaN layer is controlled within 4.5 μm±0.1 μm thickness. Under AFM, use same measurement condition and scope (5 μm*5 μm) to observe surface appearances and measure flatness of two types of n-GaN layers. Within specific implementation scope of this embodiment, the structure is optimized as follows: the structure grown over the 4-inch substrate comprises a GaN nucleating layer, 15 pairs of AlGaN/n-GaN superlattice buffer layers and n-GaN layers, in which, total thickness of the 15 pairs of AlGaN/n-GaN superlattice buffer layers is 1800 nm, and each pair of AlGaN/n-GaN superlattices is 120 nm thick; thickness ratio of the AlGaN layer and the n-GaN layer remains 1:3, i.e., each pair of AlGaN layers is 30 nm thick and each pair of n-GaN layers is 90 nm thick; further, in the $1^{st}$ pair of AlGaN/n-GaN superlattice, the Al composition content is 1%, and the n-type impurity concentration of the n-GaN layer is $5\times10^{16}$ $cm^{-3}$; proportional coefficient of composition and concentration variation of later superlattice pairs is determined based on the parabolic equation, $Yn=-0.625(n-8)^2+40$; the Al composition and n-type impurity concentration of the $2^{nd}$ AlGaN/n-GaN superlattice structure pair can be calculated based on above proportion respectively, i.e., the proportional coefficient of Al composition and n-type impurity concentration of the $2^{nd}$ pair and that of the $1^{st}$ pair is 17.5, the Al composition content is 17.5% and the n-type impurity concentration is $8.8\times10^{17}$ $cm^{-3}$; the rest may be deduced by analogy; the proportional coefficient of the $3^{rd}$ pair is 24.4, the Al composition is 24.4%, and the n-type impurity concentration is $1.2\times10^{18}$ $cm^{-3}$; the proportional coefficient of the $4^{th}$ pair is 30, the Al composition is 30%, and the n-type impurity concentration is $1.5\times10^{18}$ $cm^{-3}$; the proportional coefficient of the $5^{th}$ pair is 34.4, the Al composition is 34.4%, and the n-type impurity concentration is $1.7\times10^{18}$ $cm^{-3}$; the proportional coefficient of the $6^{th}$ pair is 37.5, the Al composition is 37.5%, and the n-type impurity concentration is $1.9\times10^{18}$ $cm^{-3}$; the proportional coefficient of the $7^{th}$ pair is 39.4, the Al composition is 39.4%, and the n-type impurity concentration is $1.96\times10^{18}$ $cm^{-3}$; the proportional coefficient of the $8^{th}$ pair is 40, which is the largest value, the Al composition is 40%, and the n-type impurity concentration is $2\times10^{18}$ $cm^{-3}$; in the later pairs, with the pair number increases, the proportional coefficient decreases, i.e., the proportional coefficient of the $9^{th}$ pair is 39.4, the Al composition is 39.4%, and the n-type impurity concentration is $1.96\times10^{18}$ $cm^{-3}$; the proportional coefficient of the $10^{th}$ pair is 37.5, the Al composition is 37.5%, and the n-type impurity concentration is $1.9\times10^{18}$ $cm^{-3}$; the proportional coefficient of the $11^{th}$ pair is 34.4, the Al composition is 34.4%, and the n-type impurity concentration is $1.7\times10^{18}$ $cm^{-3}$; the proportional coefficient of the $12^{th}$ pair is 30, the Al composition is 30%, and the n-type impurity concentration is $1.5\times10^{18}$ $cm^{-3}$; the proportional coefficient of the $13^{th}$ pair is 24.4, the Al composition is 24.4%, and the n-type impurity concentration is $1.2\times10^{18}$ $cm^{-3}$; the proportional coefficient of the $14^{th}$ pair is 17.5, the Al composition is 17.5%, and the n-type impurity concentration is $8.8\times10^{17}$ $cm^{-3}$; the proportional coefficient of the $15^{th}$ pair is 9.4, the Al composition is 9.4%, and the n-type impurity concentration is $4.7\times10^{17}$ $cm^{-3}$. For the variation trend of the Al compositions and n-type impurity concentrations with the change of number of superlattice pairs in final superlattice growth structure, refer to FIG. 5.

As shown in Table 1, the n-GaN layer grown with superlattice bottom buffer layer structure of this embodiment has flatter surface and the measured average surface height, standard deviation Rq of highest point and lowest point of surface and standard deviation Ra of measured point height and average height are higher than those of the n-GaN layer grown over the conventional non-doped GaN buffer layer structure by one order of magnitude. It can be seen that the superlattice bottom buffer layer structure of the present disclosure can effectively release wrapping and lattice stress and reduce dislocation. In addition, other advantages include effective improvement of surface flatness of GaN structure, reduction of film resistance and improvement of photoelectric performance and wavelength yield of devices.

TABLE 1

Parameter Comparison of this Embodiment and Conventional-structure GaN-based LED Epitaxial Structure

| Structure case | Surface roughness | | Average absolute height difference of surface |
|---|---|---|---|
| | Rq | Ra | |
| Conventional structure grown till n-GaN layer | 0.344 | 0.28 | 17.13 nm |
| Structure of this embodiment grown till n-GaN layer | 0.033 | 0.027 | 0.722 nm |

Embodiment 2

Different from proportional coefficient between the Al composition and the n-type impurity concentration in Embodiment 1 which adopts optimized plan of parabolic gradient mode, in this embodiment, the proportional coefficient between the Al composition and the n-type impurity concentration appears stepwise gradual increase and then gradual decrease. Each group of lattice buffer layer pair is defined as comprising a plurality of AlGaN/n-GaN superlattice buffer layer pairs, in which, Al(m) represents the Al composition value of the $m^{th}$ group AlGaN/n-GaN superlattice buffer layer pair; N(m) represents the n-type impurity concentration value of the $m^{th}$ group AlGaN/n-GaN superlattice buffer layer pair; variation trends of Al(m) and N(m) meet relational expressions: Al(m)=Yn*Al(m−1) and N(m)=Yn*M(m−1), wherein, Ym follows parabolic linear equation $$Ym = -a\left(m - \frac{M+1}{2}\right)^2 + \frac{a(M+1)^2}{4},$$

where, a is a fixed constant; M represents total number of groups comprising a plurality pairs of superlattice buffer layers; and m represents the $m^{th}$ group superlattice buffer layer pair, in which 1<m≤M and 0<a≤18.

Figure 6:
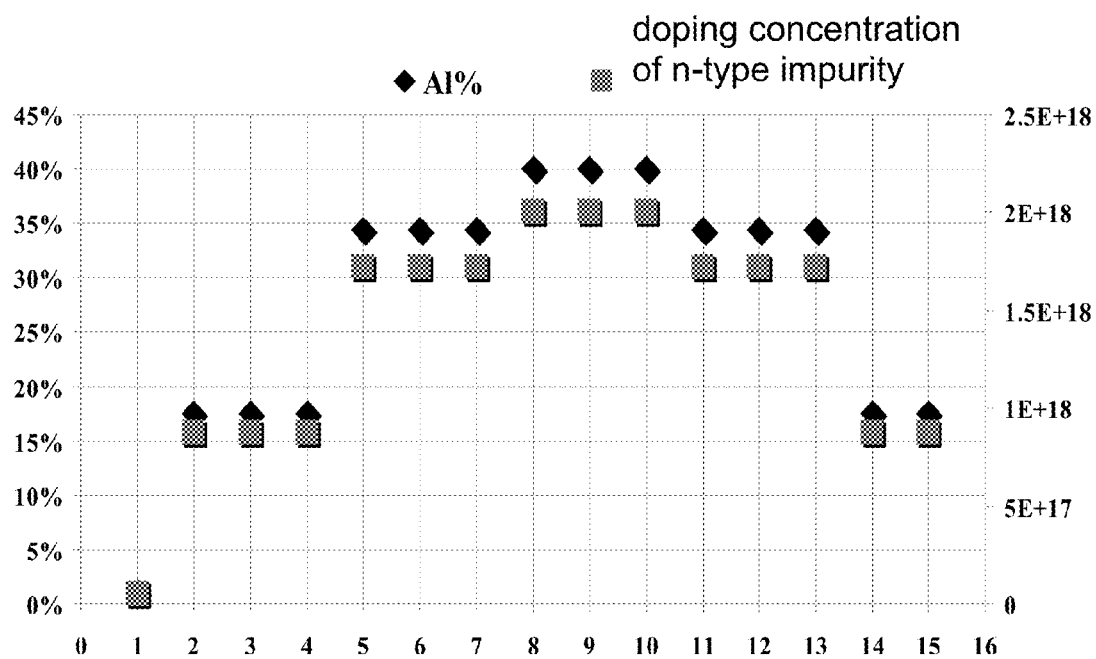
FIG. 6 is a trend drawing of Al compositions and n-type impurity concentrations with change of number of superlattice pairs in optimized superlattice structure of the GaN-based LED bottom layer in Embodiment 2 that grows to n-GaN layer.

The optimized structure grown over the 4-inch substrate is specific as: a GaN nucleating layer, 15 pairs of AlGaN/n-GaN superlattice buffer layers and n-GaN layers, in which, total thickness of the 15 pairs of AlGaN/n-GaN superlattice buffer layers is 1800 nm, and each pair of AlGaN/n-GaN superlattices is 120 nm thick; thickness ratio of the AlGaN layer and the n-GaN layer remains 1:3, i.e., each pair of AlGaN layers is 30 nm thick and each pair of n-GaN layers is 90 nm thick; next, set the $1^{st}$ pair of AlGaN/n-GaN superlattices as first group; its Al composition content is 1% and the n-type impurity concentration of the n-GaN layer is $5\times10^{16}$ cm$^{-3}$; among the remaining 14 pairs of AlGaN/n-GaN superlattice buffer layers, every 3 pairs are grouped in one group and the remaining ones, if not sufficient for three pairs can also be one group; the composition and n-type impurity concentration of superlattice pair for each group are fixed, and the proportional coefficient of Al composition and n-type impurity concentration variation between superlattice pair groups is determined by the pair number of the first sequence of that group and follows the parabolic equation $Yn=-0.625(n-8)^2+40$, i.e., the second group of superlattice comprises AlGaN/n-GaN superlattice buffer layer of consistent Al compositions and n-type impurity concentrations of $2^{nd}$, $3^{rd}$ and $4^{th}$ pairs; and the proportional coefficient of the Al compositions and n-type impurity concentrations with those of the first pair is determined based on the pair number of the first sequence, i.e., the value calculated from $Yn=-0.625(n-8)^2+40$ when n=2; in the $2^{nd}$ group of AlGaN/n-GaN superlattice, if the proportional coefficient of the Al compositions and the n-type impurity concentrations with those of the $1^{st}$ pair is 17.5, the Al composition content is 17.5% and the n-type impurity concentration is $8.8\times10^{17}$cm$^{-3}$; the rest may be deduced by analogy; the $3^{rd}$ group comprises AlGaN/n-GaN superlattice buffer layers of consistent Al compositions and n-type impurity concentrations of $5^{th}$, $6^{th}$ and $7^{th}$ pairs; when the proportional coefficient value n=5, the value calculated from formula $Yn=-0.625(n-8)^2+40$ is 34.4, and the Al composition is 34.4% and the n-type impurity concentration is $1.7\times10^{18}$ cm$^{-3}$; the $4^{th}$ group comprises AlGaN/n-GaN superlattice buffer layers of consistent Al compositions and n-type impurity concentrations of $8^{th}$, $9^{th}$ and $10^{th}$ pairs; when the proportional coefficient value n=8, the value calculated from formula $Yn=-0.625(n-8)^2+40$ is 40, and the Al composition is 40% and the n-type impurity concentration is $2\times10^{18}$ cm$^{-3}$; the $5^{th}$ group comprises AlGaN/n-GaN superlattice buffer layers of consistent Al compositions and n-type impurity concentrations of $11^{th}$, $12^{th}$ and $13^{th}$ pairs; when the proportional coefficient value n=11, the value calculated from formula $Yn=-0.625(n-8)^2+40$ is 34.4, and the Al composition is 34.4% and the n-type impurity concentration is $1.7\times10^{18}$ cm$^{-3}$; the $6^{th}$ group comprises AlGaN/n-GaN superlattice buffer layers of consistent Al compositions and n-type impurity concentrations of $14^{th}$ and $15^{th}$ pairs; when the proportional coefficient value n=14, the value calculated from formula $Yn=-0.625(n-8)^2+40$ is 17.5, and the Al composition is 17.5% and the n-type impurity concentration is $8.8\times10^{17}$ cm$^{-3}$; for the variation trend of the Al compositions and n-type impurity concentrations with the change of number of superlattice pairs in final superlattice growth structure, refer to FIG. 6, wherein, optimized selection for number of composition pairs and proportional coefficient is available based on actual implementation environments.

As measured, photoelectric performance and wavelength yield of the GaN-based LED epitaxial structure grown over the superlattice bottom buffer layer disclosed in present disclosure can improve by at least 5% in average in comparison with that grown over conventional non-doped GaN bottom buffer layer; and by at least 15% if applied in large-size substrate, e.g., 4-inch substrate, therefore having good effects in reducing output cost per LED, improving output efficiency per LED and improving performance in large power device.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An LED epitaxial structure, from bottom to up, comprising: a substrate; a GaN nucleating layer; a superlattice buffer layer comprising a plurality pairs of alternately stacked AlGaN/GaN structures; an n-type GaN layer; a MQW light-emitting layer, a p-type GaN layer, and a p-type contact layer; wherein an Al composition value of an $n^{th}$ AlGaN/GaN superlattice buffer layer pair is represented by Al(n); an n-type impurity concentration value of the $n^{th}$ AlGaN/GaN superlattice buffer layer pair is represented by N(n); a variation trend of Al(n) is from gradual increase to gradual decrease, and a variation trend of N(n) is from gradual increase to gradual decrease.

2. The LED epitaxial structure of claim 1, wherein the variation trends of Al(n) and N(n) satisfy a relational expression: Al(n)=Yn*Al(n−1) and N(n)=Yn*N(n−1), wherein Yn follows a parabolic linear equation $$Yn = -a\left(n - \frac{N+1}{2}\right)^2 + \frac{a(N+1)^2}{4},$$

wherein a is a fixed constant; n represents an $n^{th}$ superlattice buffer layer, in which 1<n≤ a total number of pairs of superlattice buffer layers, and 0<a≤18.

3. The LED epitaxial structure of claim 1, wherein each group of lattice buffer layer pair comprises a plurality of AlGaN/GaN superlattice buffer layer pairs, in which, Al(m) represents an Al composition value of an $m^{th}$ group AlGaN/GaN superlattice buffer layer pair; N(m) represents an n-type impurity concentration value of the $m^{th}$ group AlGaN/GaN superlattice buffer layer pair; the variation trends of Al(m) and N(m) satisfy a relational expression: Al(m)=Ym*Al(m−1) and N(m)=Ym*M(m−1), wherein, Ym follows a parabolic linear equation $$Ym = -a\left(m - \frac{M+1}{2}\right)^2 + \frac{a(M+1)^2}{4},$$

wherein a is a fixed constant; M represents a total number of groups comprising a plurality pairs of superlattice buffer layers; and m represents an $m^{th}$ group superlattice buffer layer pair, in which 1<m≤M and 0<a≤18.

4. The LED epitaxial structure of claim 1, wherein a number of AlGaN/GaN superlattice buffer layer pairs varies from 3 to 40.

5. The LED epitaxial structure of claim 1, wherein the substrate comprises at least one of sapphire ($Al_2O_3$), silicon carbide (SiC), silicon (Si), germanium (Ge), gallium nitride (GaN), aluminum gallium nitride (AlGaN), or aluminum nitride (AlN).

6. The LED epitaxial structure of claim 1, wherein in each pair of AlGaN/GaN superlattice buffer layers, an n-type doping impurity in the n-type GaN layer is Si, and a p-type doping impurity in the p-type GaN layer is Mg.

7. The LED epitaxial structure of claim 1, wherein Al composition of the AlGaN layer of each pair of AlGaN/GaN superlattice buffer layers varies from 0% to 40%.

8. The LED epitaxial structure of claim 1, wherein an n-type impurity concentration of the n-type GaN layer of each pair of AlGaN/GaN superlattice buffer layers varies from $5 \times 10^{16}$ $cm^{-3}$ to $1 \times 10^{19}$ $cm^{-3}$.

9. The LED epitaxial structure of claim 1, wherein a thickness of the AlGaN layer of each pair of AlGaN/GaN superlattice buffer layers varies from 0.1 nm to 40 nm.

10. The LED epitaxial structure of claim 1, wherein a thickness of the n-type GaN layer of each pair of AlGaN/GaN superlattice buffer layers varies from 0.3 nm to 120 nm.

11. The LED epitaxial structure of claim 1, wherein a thickness ratio of the AlGaN layer and corresponding n-type GaN layer of each pair of AlGaN/GaN superlattice buffer layers is 1:5-1:1.

* * * * *